United States Patent
Welborn

(10) Patent No.: US 7,002,940 B2
(45) Date of Patent: Feb. 21, 2006

(54) MULTIPLE-STAGE FILTERING DEVICE AND METHOD

(75) Inventor: Matthew L. Welborn, Vienna, VA (US)

(73) Assignee: Freescale Semiconductor, Inc., Austin, TX (US)

( * ) Notice: Subject to any disclaimer, the term of this patent is extended or adjusted under 35 U.S.C. 154(b) by 58 days.

(21) Appl. No.: 10/868,948

(22) Filed: Jun. 17, 2004

(65) Prior Publication Data

US 2005/0201287 A1   Sep. 15, 2005

Related U.S. Application Data

(60) Provisional application No. 60/552,447, filed on Mar. 12, 2004.

(51) Int. Cl.
*H04B 7/216*   (2006.01)

(52) U.S. Cl. .................. 370/335; 370/342; 455/307; 375/343; 375/350

(58) Field of Classification Search ............... 370/335, 370/342, 389, 441; 708/300; 455/307; 375/229, 375/142, 152, 343, 350
See application file for complete search history.

(56) References Cited

U.S. PATENT DOCUMENTS

| | | | | |
|---|---|---|---|---|
| 4,896,320 | A * | 1/1990 | Gockler | 370/497 |
| 5,881,179 | A * | 3/1999 | Gillard | 382/261 |
| 2002/0126644 | A1 * | 9/2002 | Turpin et al. | 370/342 |
| 2002/0136277 | A1 * | 9/2002 | Reed et al. | 375/148 |
| 2004/0146132 | A1 * | 7/2004 | Staszewski et al. | 375/376 |

* cited by examiner

*Primary Examiner*—Ajit Patel
(74) *Attorney, Agent, or Firm*—Posz Law Group, PLC

(57) ABSTRACT

A filter is provided that is formed of multiple filter stages arranged in series. Each of these filter stages has an input tap at its input that can be selectively connected to a filter input signal, and an output tap at its and output that can be selectively connected to an output selection circuit. Adjacent pairs of filter stages can also be isolated from each other. By selectively connecting the various input and output taps, and selectively isolating pairs of filter stages from each other, the filter can be formed into a single long filter or a plurality of parallel filters anywhere in size from one filter stage up to half the total number of filter stages. The output selection circuit can then sequentially select whatever filter stage outputs are connected to it and provide those as a general filter output.

22 Claims, 7 Drawing Sheets

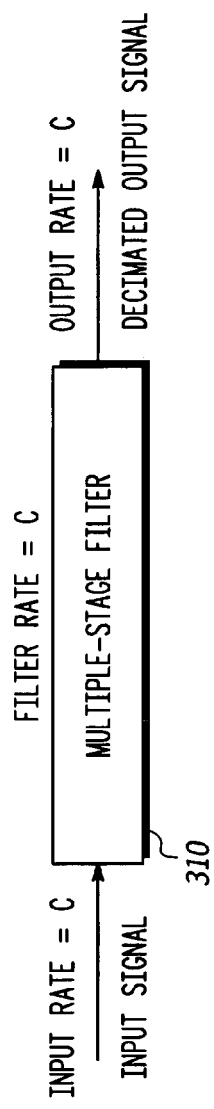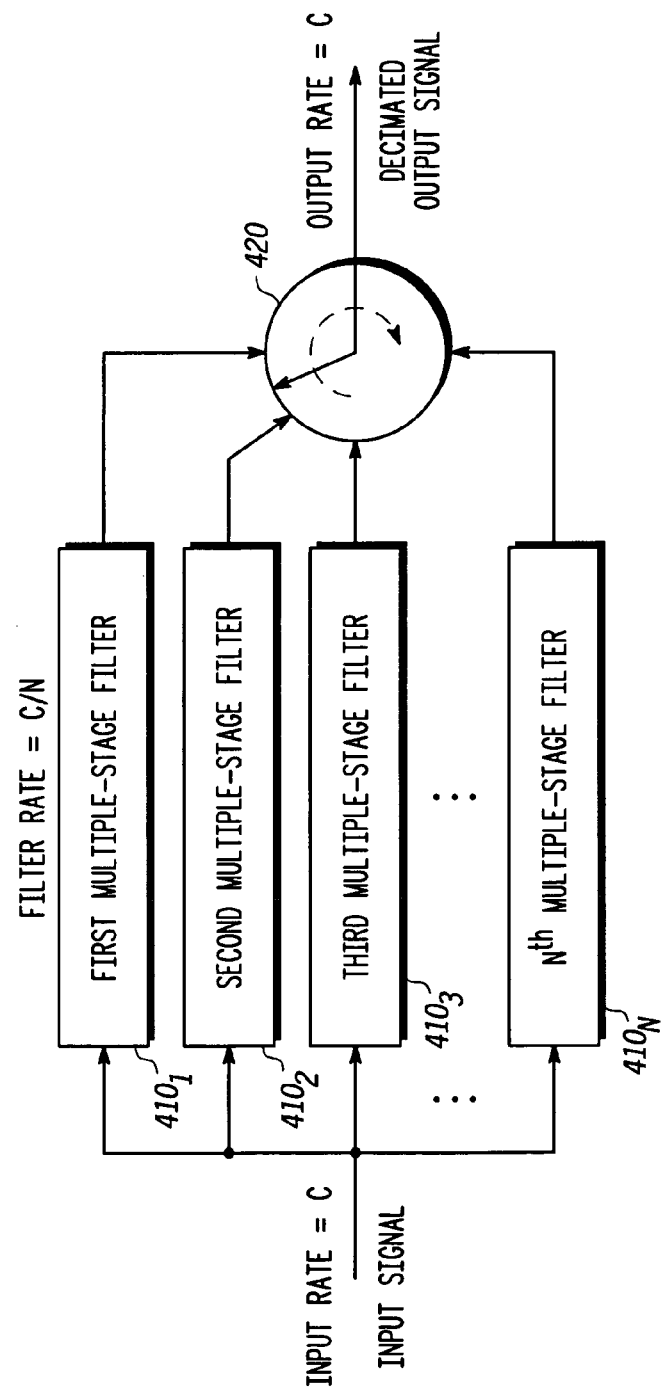

MULTIPLE-STAGE FILTERING DEVICE AND METHOD

CROSS-REFERENCE TO RELATED PATENT DOCUMENTS

This application relies for priority on U.S. provisional application Ser. No. 60/552,447, by Matthew L. Welborn, filed Mar. 12, 2004, entitled "A DIRECT-SEQUENCE ULTRA-WIDEBAND DEVICE AND METHOD," the contents of which are hereby incorporated by reference in its entirety.

FIELD OF THE INVENTION

The present invention relates in general to wireless communication systems, such as ultrawide bandwidth (UWB) systems, including mobile transceivers, centralized transceivers, and related equipment. More specifically, the present invention relates to filters that are used in such devices process input signals, to operate an equalizer.

BACKGROUND OF THE INVENTION

As ultrawide bandwidth (UWB) technology becomes increasingly desirable for wireless devices, it becomes more and more necessary to set a standard for UWB operations. The Institute for Electrical and Electronic Engineers (IEEE) has designated that the 802.15.3™ standard be drafted to cover high rate wireless personal area networks (WPANs), which covers UWB communications.

One proposal offered for the 802.15.3™ standard is a direct sequence-ultrawide bandwidth (DS-UWB) proposal. In general, a UWB physical (PHY) layer protocol uses high rate, ultra-wide bandwidth pulses to send data at rates up to 1000 Mbps. One particular DS-UWB approach divides the available spectrum into upper and lower bands, the lower band being between 3.1 to 5.15 GHz and the upper band being between 5.825 and 10.6 GHz. Information is then encoded in these bands using direct-sequence spread spectrum techniques. In particular, pulse filtering/shaping may be used with BPSK/QPSK modulation with 50% excess bandwidth, root-raised-cosine impulse response. The chip rate, center frequency, and symbol rate in this DS-UWB proposal can be harmonically related.

It is desirable for any UWB technology to capable of supporting multiple application types. Two key applications are wireless in-room video distribution and handheld applications. However, each of these two applications has significantly different device requirements. The class of in-room video distribution applications is characterized by a need for high data rates with multiple users, robust performance, and low sensitivity to power requirements. In contrast, the class of handheld applications imposes stringent requirements for low cost and power consumption, with the additional requirement for scalability to extremely high data rates (1000+ Mbps).

Therefore, it is desirable that any DS-UWB PHY layer proposal enable a UWB device using the IEEE 802.15.3a standard to provide both the high performance capabilities required by wireless in-room video distribution, as well as the low power/cost scalability required for high-rate handheld applications.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

FIG. 3 is a block diagram of an input structure using a multiple-stage filter implementation, according to one embodiment of the present invention;

FIG. 4 is a block diagram of an input structure using multiple parallel filters according to one embodiment of the present invention;

DETAILED DESCRIPTION OF PREFERRED EMBODIMENTS

Figure 1:
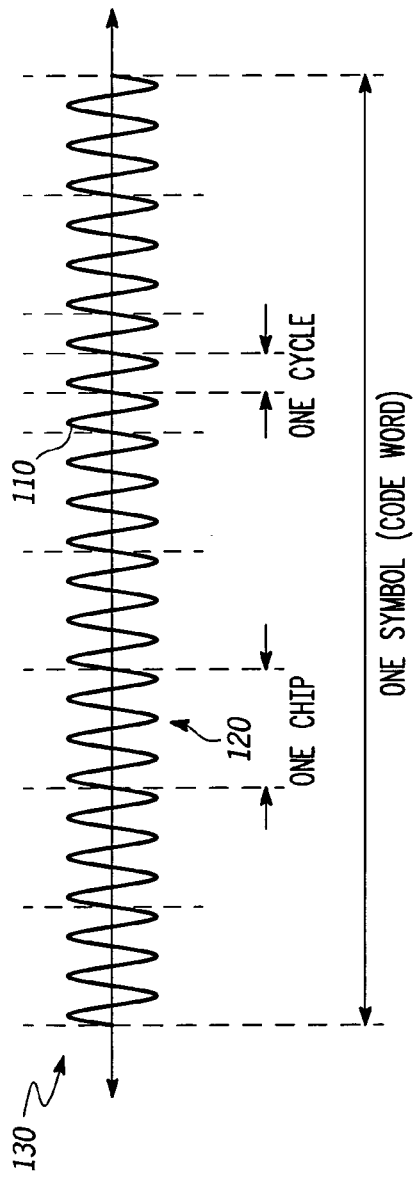
FIG. 1 is a graph showing an exemplary DS-UWB symbol, according to one embodiment of the present invention.

DS-UWB implementations provide significant advantages for UWB transmissions. This invention provides a variety of ways to enhance the operation of a DS UWB system. A disclosed DS-UWB embodiment uses a comparatively low complexity forward error correction (FEC) code that reduces the decoder complexity by 50% as compared to certain alternate designs, with little or no performance impact. In addition, the disclosed design relies on a simple modulation technique, e.g., binary phase shift keying (BPSK) that provides both comparatively lower complexity and more efficient architectures for multipath energy collection and inter-symbol interference (ISI) mitigation.

Together these features lead to improved scalability and to both higher data rates and lower cost/power implementations. Regarding scalability, these features support scalability to data rates exceeding 1000+ Mbps at the same time as they support low cost/power implementations that are less than half the complexity of other UWB PHYs currently under consideration by the IEEE 802.15.3a Task Group.

Also, the disclosed DS-UWB design presents a simple frequency plan that is harmonized with a proposed common signaling mode (CSM) that can serve as the basis of a single unified PHY standard for TG3a that supports both multiband orthogonal frequency division multiplexing (MB-OFDM) and DS-UWB approaches for high-rate applications.

Details of the DS-UWB Proposal

The disclosed DS-UWB embodiment is based on the use of high-rate coded UWB pulses to provide scalable performance. In particular, the disclosed embodiment is based on the use of variable length codes to provide scalable data rates exclusively using binary phase-shift-keying (BPSK) of UWB pulse sequences. Embodiments of the DS-UWB system support data rates of 28, 55, 110, 220, 500, 660, 1000, & 1320 Mbps, as shown in Table 1 below.

This scalable support is achieved through the use of a fixed UWB "chip rate" in conjunction with variable length "spreading" code words and different forward error correction (FEC) rates (e.g., ½, ¾, and 1), to efficiently scale data rates. A brief discussion of terminology is given below for the sake of clarity.

In one embodiment of the present invention, each bit of data is represented by a bi-phase modulated symbol (also called a code word). Each symbol is in turn formed from one or more chips, which may themselves be modulated (e.g., using binary or ternary modulation). These chips may be formed from a variety of wavelet types. However, in many embodiments, the chips are each made up of one or more cycles of a carrier waveform.

In one particular embodiment, the chips are root-raised cosine (RRC) pulse with 30% excess bandwidth. In particular, each chip (i.e., each pulse) may comprise three cycles of an RRC signal. In alternate embodiments, different chips can be used. For example, a Gaussian monopulse could be used as a chip. Numerous other wavelets can be used as chips, however, depending upon the requirements of the UWB system.

Each symbol (i.e., each code word) may be made up of a sequence of L chips, which are used to represent a single data bit. In particular, each L-chip sequence may be modulated by the value of a data bit, i.e., the L chips in the sequence are each multiplied by either +1 (i.e., they remain unchanged), or by −1 (i.e., they are inverted) to indicate a digital "1" or "0." This modulation process produces a binary-phase-shift-keyed (BPSK) signal. In addition, as noted above, the L-chip sequences can themselves be encoded using a binary or ternary code.

By way of example, a ternary system will be described. A binary system would follow the same modulation procedure as a ternary system, except that modulation values of 0 would not be allowed.

When encoding chips using ternary modulation, rather that having the L-chip sequences being just a repetition of L identical chips in the same orientation, individual chips within the L-chip sequence can be modulated according to a ternary value, i.e., one of +1, −1, or 0. For example, one 12-bit chip might have a sequence of 1 1-1 0 0 1-1-1-1 0 1 1, i.e., it is made up of a series of 12 chips, each multiplied by the corresponding value in the 12 value ternary sequence.

As above, when each coded L-chip sequence is modulated by a data bit, the signs of the L elements of the sequence are multiplied by either +1 (i.e., they remain unchanged), by −1 (i.e., they are inverted). In the case of a ternary value of 0, the chip retains a value of 0 regardless of the data bit.

FIG. 1 is a graph showing an exemplary DS-UWB symbol, according to one embodiment of the present invention. In this embodiment, a 3-cycle chip used in an 8-chip symbol. As shown in FIG. 1, each chip 120 is made up of a sequence of three cycles 110. Eight chips 120 are then put together to form a symbol 130 that is used to represent a bit of data.

In a simple system, the symbol 130 is modulated by a data bit to represent the bit in a signal. If the symbol 130 remains unchanged, it represents one digital value, and if it is inverted, it represent the other digital value (e.g., an unchanged symbol 130 could represent a digital "1" while an inverted symbol 130 could represent a digital "0"). If coding is used, the basic sequence 130 is multiplied by a code to produce a coded sequence.

Figure 2:
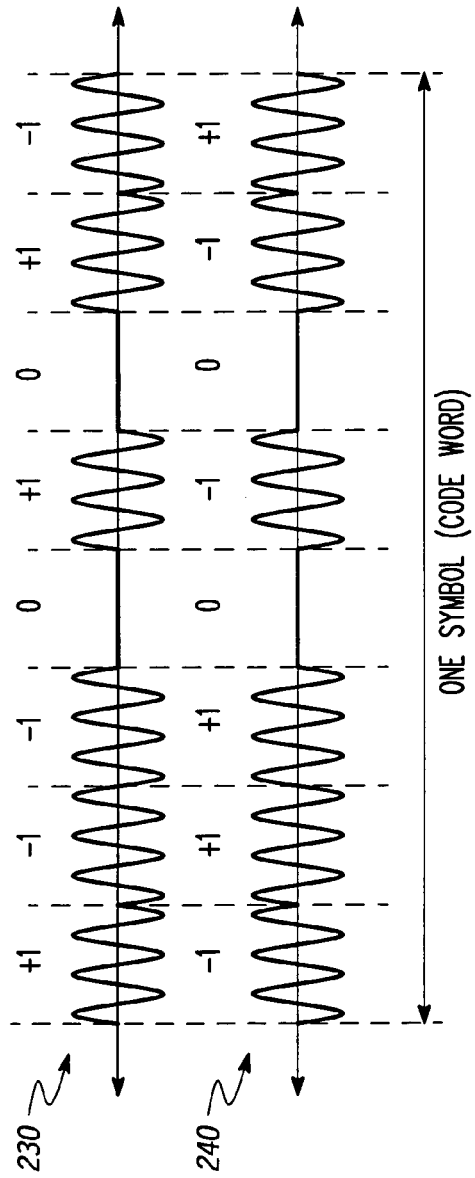
FIG. 2 is a graph showing a ternary encoded symbol, according to one embodiment of the present invention.

FIG. 2 is a graph showing a ternary encoded symbol, according to one embodiment of the present invention. As in FIG. 1, the symbol in FIG. 2 uses a 3-cycle chip in an 8-chip symbol. In this embodiment a ternary code of 1-1-1 0 1 0 1-1 is used on the symbol 130 to generate a ternary encoded symbol 230. This coded symbol 230 is then modulated by a data bit to represent the bit in a signal such that the coded symbol 230 unchanged represents one digital value, and an inverted coded symbol 240 represent the other digital value.

In some embodiments 3 or 9 cycles are used per chip. However, other numbers of cycles per chip or chips per sequence could be used in alternate embodiments. The nominal chip rate in the disclosed embodiment (i.e., the rate at which chips are generated) is 1326 MHz. However, this chip rate could vary in alternate embodiments.

In some embodiments the spreading codes vary in length from L=24 (for acquisition & low rates) to L=1 (for extremely high rates, 1000+ Mbps). For code lengths of L=24 and L=12, the DS-UWB PHY may use special ternary codes that provide a balance of good spectral properties with low code cross-correlation. This allows excellent multi-user separation between networks (e.g., piconets), especially during the acquisition process. In alternate embodiments no symbol coding or binary symbol coding can be used. Furthermore, code lengths above L=24 can be used in some embodiments that require greater accuracy.

For code lengths of L=6 or less, the code words may use a single non-zero chip (i.e., pulse) value, with the remaining chip values being zero (e.g. the code for length L=3 is 1-0-0). Since a chip value of zero results in a chip with zero amplitude, this means that for code lengths of L=6 or less, the code words will have only a single chip in the symbol with any amplitude. This kind of a code can be referred to as a single-pulse code. The use of single-pulse codes provides optimal spectral flatness (i.e., 0 dB transmit back-off) and good performance when scaling to extremely high data rates.

Although it uses relatively high chip rates, the disclosed DS-UWB embodiment is still a true "pulse-based" UWB system in that each transmitted pulse (i.e., chip or wavelet) has the same pulse shape at passband (that is, after begin translated to the RF center frequency). This property is achieved by making the center frequency ($F_{center}$) of the DS-UWB signal an integer multiple of the chip rate ($F_{chip}$). In the disclosed embodiment $F_{center} = 3 \times F_{chip}$ for all of the support modes. However, alternate embodiments could use a different formula (e.g., making $F_{center} = n \times F_{chip}$, where n can be any integer). An integer relationship between center frequency $F_{center}$ and chip frequency $F_{chip}$ provides a significant advantage in that it allows relatively simple frequency synthesis, pulse generation and demodulation of the DS-UWB waveforms.

As shown in Table 1, the disclosed DS-UWB embodiment can use a convolutional code with constraint length k=6 to achieve good range performance for the various modes. This code is used as either a rate R=½ code, or is punctured to rate R=¾ for some optional modes. The choice of a k=6 code offers an excellent performance/complexity trade-off and requires only half the complexity of a k=7 code. Since there is very little performance difference in practical implementations, a k=6 code may be used. However, the current invention is applicable to other length codes. The convolutional code is used in conjunction with a convolutional interleaver that helps to de-correlate any initial demodulator errors, thereby maximizing the benefits of the FEC coding.

TABLE 1

| Data Rate | FEC Rate | Code Length | Range (AWGN) |
| --- | --- | --- | --- |
| 9.2 Mbps | ½ | 24 | 29.3 m |
| 28 Mbps | ½ | 24 | 29.4 m |
| 55 Mbps | ½ | 12 | 22.1 m |
| 110 Mbps | ½ | 6 | 18.3 m |
| 220 Mbps | ½ | 3 | 12.9 m |
| 500 Mbps | ¾ | 2 | 7.3 m |
| 660 Mbps | 1 | 2 | 3 m |
| 1000 Mbps | ¾ | 1 | 5 m |
| 1320 Mbps | 1 | 1 | 2 m |

In particular, Table 1 shows supported data rates for low band operation in one embodiment of the present invention. The information in Table 1 is based on assumptions for range estimates that include transmit power adjustments for code word spectrum (transmit back-off of 1.2–1.9 dB), 6.6 dB CMOS noise figure for receiver, 2.5 dB implementation loss for data rates up to 220 Mbps (3 dB implementation loss for rates >=500 Mbps).

In the embodiment shown in Table 1, the 9.2 Mbps mode represents a common signaling mode (CSM) that uses a chip rate of ⅓ times the nominal chip rate (and therefore ⅓ the signal bandwidth, i.e., ⅓ of the low rate of 28 Mbps); the modes using 9.2 Mbps, 28 Mbps, 110 Mbps, and 220 Mbps represent modes that are currently designated as mandatory for IEEE TG3a devices; the uncoded modes at 660 Mbps and 1320 Mbps allow for extremely high speed data transfer using very low complexity implementations; and the high-performance modes at 500 Mbps and 1000 Mbps may require FEC decoder operation at high speed (500 or 1000 MHz).

In addition, the low fading characteristics of the DS-UWB waveform allow the system to be operated even without coding to support applications that benefit from extremely high data rates with very low power consumption. In particular, the disclosed embodiments of a DS-UWB device can provide either 660 or 1320 Mbps using un-coded operation for short-range operation with very low complexity. However, this type of operation may be impractical for approaches that use narrowband modulation, since such systems must always have FEC to compensate for severe signal fades induced by the use of narrow modulated carriers.

As noted above, the reference pulse shape (i.e., the chip shape or wavelet shape) may be a root-raised cosine (RRC) pulse with 30% excess bandwidth. This baseline UWB pulse shape (in conjunction with the center frequencies) determines the desired signal operating bands. To provide spectral flexibility, however, compliant devices can use any of a number of different techniques to produce modified pulses in order to control the spectrum of the DS-UWN transmit signal. These can include linear pulse combination, adaptive band rejection techniques, fixed or adaptive notch filters to control spectrum. In addition, pulse design using high-speed/low-precision DACs can be used to generate crafted pulses for precise spectral control of pulse waveforms.

This approach to spectral control allows devices to provide flexible spectrum for co-existence without the need for any extra protocols or transmitter-receiver handshaking in order to negotiate dynamic band or tone usage.

Multiple Network Support

The disclosed DS-UWB design provides excellent support for multiple network (i.e., multiple piconet) operation. First, the design defines two frequency bands for network operation: a "low band" from 3.1 to 4.85 GHz and a "high band" from 6.2 to 9.7 GHz. (Alternate embodiments can use more or fewer bands, and can alter the precise parameters of these bands.)

Device operation in the high band is similar to that in the low band (e.g., as shown in Table 1), except that the high band signals use center frequencies and chip rates that are twice those defined for the low band. This results in high band signals that have twice the bandwidth of low band signal and therefore twice the transmit power. This bandwidth and power advantage for high band signals helps to mitigate the slightly higher losses inherent to operation with higher center frequencies.

Within each of the two signal bands the disclosed DS-UWB embodiment uses spread spectrum techniques to allow operation of multiple networks in a shared manner based on offset chipping rates and separate codes for each piconet. Through the use of these offsets and codes, DS-UWB ensures that any multiple access interference appears as uncorrelated Gaussian noise, thus minimizing any impact on performance and maximizing the ability to gracefully support multiple networks.

For low band operation, one embodiment uses four baseline chip rates: $F_{chip}$=1313, 1326, 1339, 1352 MHz. In this embodiment these chip rate frequencies are offset by 13 MHz per network, and all frequencies can be derived using low cost 26 MHz reference crystals (i.e., the sort widely used in cellular phones). Optionally, two additional chip rates of 1300 & 1365 MHz can be used to allow a total of 6 networks in the low band (for a total of up to 12 networks using both low and high bands). However, alternate embodiments could use more or fewer frequency offsets, as desired, and can vary the amount of the frequency offset. For ease of discussion, a single baseline chip rate of 1326 MHz will be described below. However, any variety of frequency offsets can be used with this design.

To ensure good piconet separation during acquisition, the PHY preambles may be based on low cross-correlation length L=24 code words for good performance in all multipath conditions.

Complexity Considerations

As mentioned above, it would be advantageous to provide a DS-UWB embodiment that can meet the requirements for a wide range of wireless applications, including both wireless in-room audio/visual distribution and handheld applications. To provide efficient scalability across this wide range of applications, it is desirable to take advantage of both the natural scaling of the RF multipath environment and the application requirements themselves. The result of these improvements has been a significant reduction in implementation complexity for the entire range of applications, and a particularly large complexity reduction for modes that would support high-rate handheld applications.

One feature in this complexity reduction for the disclosed embodiments is the selection of BPSK as the modulation for the DS-UWB design. As seen in Table 1, the use of BPSK means that every data symbol carries one (coded) bit and that as the data rate increases the symbol rate naturally increases as well. For a DS-UWB receiver implementation, the two functions of multipath energy capture and inter-symbol interference (ISI) compensation are naturally performed at the symbol rate, so this scalability with data rate is important.

However, although BPSK is one possible embodiment, aspects of the present invention are equally applicable to other modulation schemes. For example, the current designs would be applicable to an MBOK modulation scheme, although certain advantages of BPSK would not be achieved.

To understand this scalability, consider the processing requirements for two very different operating regimes of the DS-UWB receiver. At lower data rates and longer ranges, the symbol rate will be low (i.e., the symbol length will be large), but likewise, the multipath delay spreads of the channel will likely be longer. This provides a natural scaling of energy collection. As a result, a rake or channel-matched filter (CMF) structure in a receiving device will require more taps (i.e., a longer time span of symbol energy collection) and will operate at lower speeds (lower symbol rate).

At higher data rates and shorter ranges, the high symbol rate will allow for higher speed rake or CMF operation, but these same structures would then require fewer taps to achieve effective multipath energy collection in the shorter multipath channels.

Thus the natural scaling of the multipath channel will allow a flexible implementation to provide efficient energy collection by trading longer filters at lower rates and shorter filters at high rates—the same transistors can serve both purposes in a well designed receiver. This same principle is true for equalizer structures: flexible linear or non-linear (DFE) structures can span more symbols at low symbol rates in longer channels and still provide high rate operation and good performance in shorter channels.

It should be observed that the present invention is applicable to any portion of a UWB device in which filters will be operated at different speeds in different modes. For example, a rake receiver comprises such filters, as does an equalizer. The present invention should not be limited to any particular filter position, but can be used in any filter situation for which its features would be advantageous.

Input Filter Design

In a UWB receiver, the required filter scaling matches multipath channel scaling. In such a receiver, the effective energy collection depends on the filter length relative to the multipath channel delay spread, and any extra taps in the input filter longer than the channel are wasted. Furthermore, multipath delay spread increases with range. This means that low data rate modes, which operate at long ranges, require long filters, while high rate modes, which operate at shorter ranges, require shorter filters.

A flexible architecture can provide longer filters at lower data rates (i.e., longer ranges) and shorter filters at higher rates (i.e., shorter ranges). This can dramatically reduce the complexity of rake/CMF in the receiver design.

The same effect is true with equalizers, i.e., the required length of equalizer depends on delay spread. Low data rates require longer delay spreads, while higher rates will need comparatively shorter delay spreads.

In one receiver implementation, a multiple stage filter can provide for multipath channel scaling. FIG. 3 is a block diagram of an input structure using a multiple-stage filter implementation, according to one embodiment of the present invention. As shown in FIG. 3, the input structure includes a multiple-stage filter 310. In the disclosed embodiment this multiple-stage filter 310 is a finite impulse response (FIR) filter, though in alternate embodiments infinite impulse response (IIR) filters could be used.

As shown in FIG. 3, the multiple-stage filter 310 receives an input signal at an input rate equal to the chipping rate C, processes the input signal at a filter rate equal to the chipping rate C, and provides a decimated output signal also at an output rate also equal to the chipping rate C.

In the embodiment shown in FIG. 3, the chipping rate C is on the order of 1326 MHz. However, currently affordable finite impulse response filters of an acceptable complexity generally can only operate up to about 200 Mbps. As a result, providing a filter that can operate at the current chipping rate C would be very expensive. It is therefore desirable to provide an alternate design that reduces the speed at which the multiple-stage filter 310 must operate.

It is of course understood that speeds of components will continue to increase with time. Thus, although 200 Mbps is the current effective filter limit for affordable filters, this limit is expected to rise with time. However, it is understood that it will always be desirable to have a chipping rate that is greater than the maximum affordable filter speed in some implementations. Nevertheless, regardless of the absolute speed of components, the current invention is applicable when the relative desired (or maximum allowable) filter rate is lower than the desired chipping rate.

FIG. 4 is a block diagram of an input structure using multiple parallel filters according to one embodiment of the present invention. As shown in FIG. 4, the input structure includes first through $N^{th}$ multiple-stage filters $410_1$–$410_N$ and an N-input switch 420.

The first through $N^{th}$ multiple-stage filters $410_1$–$410_N$ each receive the same input signal at an input rate equal to the chipping rate C. However, each of the first through $N^{th}$ multiple-stage filters $410_1$–$410_N$ operates at a filter rate equal to $$\frac{1}{N}^{th}$$

the chipping rate $$\left(i.e., \frac{C}{N}\right).$$

But the N-input switch 420 operates at the chipping rate C, cycling through the outputs of each of the first through $N^{th}$ multiple-stage filters $410_1$–$410_N$ in turn (i.e., it operates as a multiplexer). As a result, the N-input switch 420 provides an output signal at an output rate equal to the chipping rate C.

By having N multiple-stage filters $410_1$–$410_N$ connected in parallel, this circuit allows each individual filter to operate at a lower rate of $$\frac{C}{N},$$

C/N while providing an effective filter output at the higher chipping rate C. However, this comes at the cost of additional filter circuits, which take up valuable die space and increase the power consumption of the receiver.

Although the circuit of FIG. 4 discloses the use of an N-input switch 420, alternate embodiments could provide the outputs of the N multiple stage filters 410$_1$–410$_N$ as a parallel bus.

In the disclosed DS-UWB design, however, the filters need only match symbols, and not chips, and so can operate at the symbol rate, not the chipping rate (which will be a shorter rate for all situations excepts a symbol length of 1).

Figure 5:
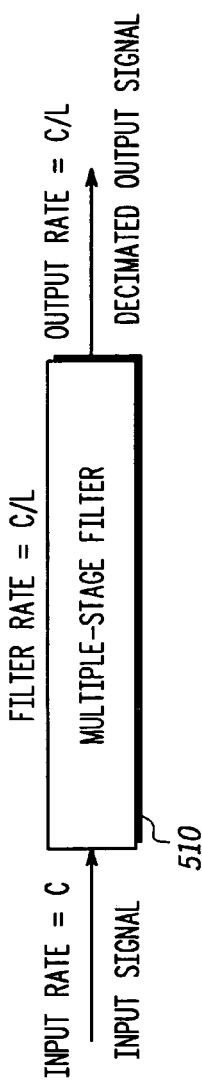
FIG. 5 is a block diagram of an input structure using a multiple-stage filter implementation, according to another embodiment of the present invention.

FIG. 5 is a block diagram of an input structure using a multiple-stage filter implementation, according to another embodiment of the present invention. In this embodiment the multiple stage filter operates as the symbol rate $$\frac{C}{L},$$

rather than the chipping rate C. As shown in FIG. 5, the input structure includes a multiple-stage filter 510. In this embodiment the multiple-stage filter 510 is an FIR filter, though an IIR filter could be used in alternate embodiments.

As shown in FIG. 5, the multiple-stage filter 510 receives an input signal at an input rate equal to the chipping rate C, processes the input signal at a filter rate corresponding to the symbol rate equal to the chipping rate C divided by the symbol length L $$\left(i.e., \text{ at a filter rate of } \frac{C}{L}\right),$$

and provides a decimated output signal also at an output rate also equal to the symbol rate $$\left(i.e., \text{ at an output rate of } \frac{C}{L}\right).$$

In one embodiment, the chipping rate C is on the order of 1326 MHz. And as noted above, currently affordable finite impulse response filters of an acceptable complexity generally can only operate up to about 200 Mbps. This means that for symbol lengths of 7 or greater, and a chipping rate of 1326 MHz, the symbol rate will be below 200 MHz, and so a single multiple-stage filter 510 can properly process a signal. (As the chipping rate varies in alternate embodiments, the relative symbol rate that allows for a single multiple-stage filter 510 will also vary.)

Figure 6:
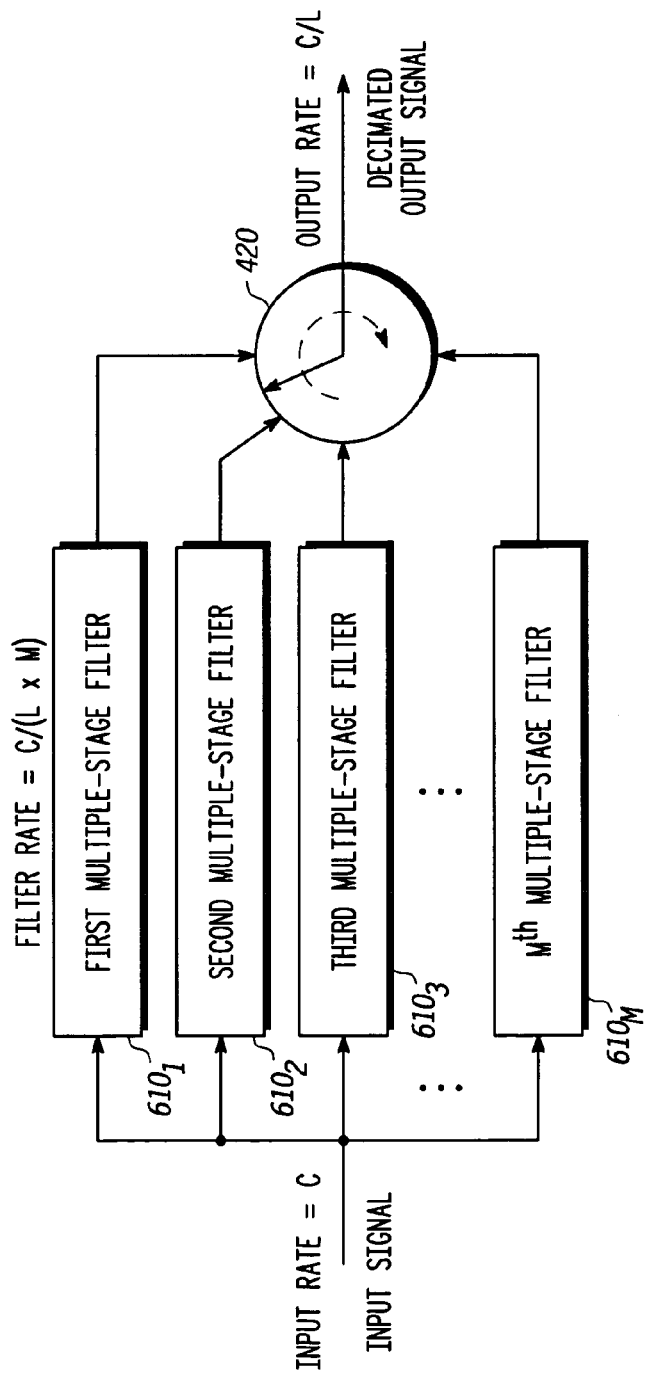
FIG. 6 is a block diagram of an input structure using multiple parallel filters according to another embodiment of the present invention.

It is also possible, however, to provide multiple filters in parallel in place of the single multiple-stage filter 510 of FIG. 5. FIG. 6 is a block diagram of an input structure using multiple parallel filters according to another embodiment of the present invention. In this embodiment multiple parallel filters are used. As shown in FIG. 6, the input structure includes first through M$^{th}$ multiple-stage filters 610$_1$–610$_M$ and an M-input switch 620.

The first through M$^{th}$ multiple-stage filters 610$_1$–610$_M$ each receive the same input signal at an input rate equal to the chipping rate C. However, each of the first through M$^{th}$ multiple-stage filters 610$_1$–610$_M$ operates at a filter rate equal to $$\frac{1}{M}^{th}$$

the symbol rate $$\left(i.e., \frac{C}{L \cdot M}\right).$$

But the M-input switch 620 operates at the symbol rate $$\frac{C}{L},$$

cycling through the outputs of each of the first through M$^{th}$ multiple-stage filters 610$_1$–610$_M$ in turn (i.e., it operates as a multiplexer). As a result, the M-input switch 620 provides an output signal at an output rate equal to the symbol rate $$\frac{C}{L}.$$

By having M multiple-stage filters 610$_1$–610$_M$ connected in parallel, this circuit allows each individual filter to operate at a lower rate of $$\frac{C}{L \cdot M},$$

while providing an effective filter output at the higher symbol rate $$\frac{C}{L}.$$

However, this comes at the cost of additional filter circuits, which take up valuable die space and increase the power consumption of the receiver.

Although the circuit of FIG. 6 discloses the use of an M-input switch 620, alternate embodiments could provide the outputs of the M multiple stage filters 610$_1$–610$_M$ as a parallel bus.

An alternate solution to this input structure is to provide a multiple-stage filter, but have multiple taps included in it so that it can be effectively split up into multiple smaller stage filters.

Figure 7:
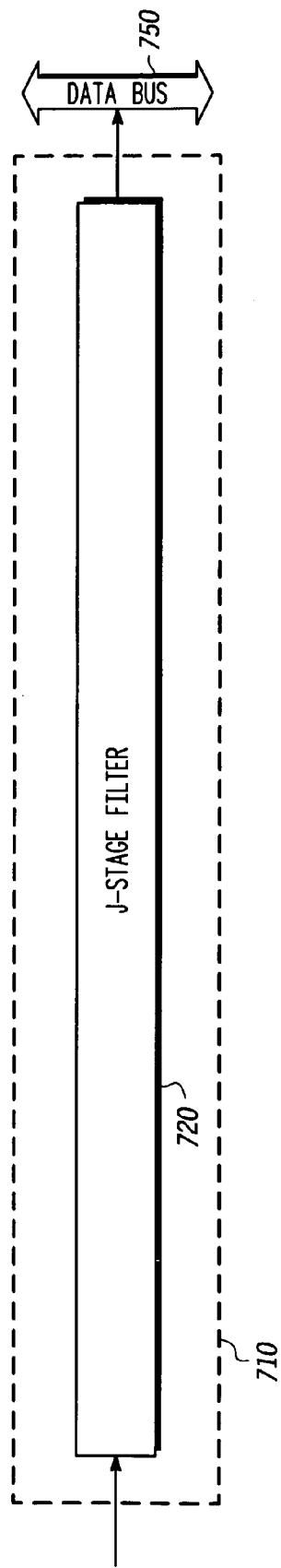
FIG. 7 is a block diagram of a multiple stage filter in which one tap is used.
Figure 8:
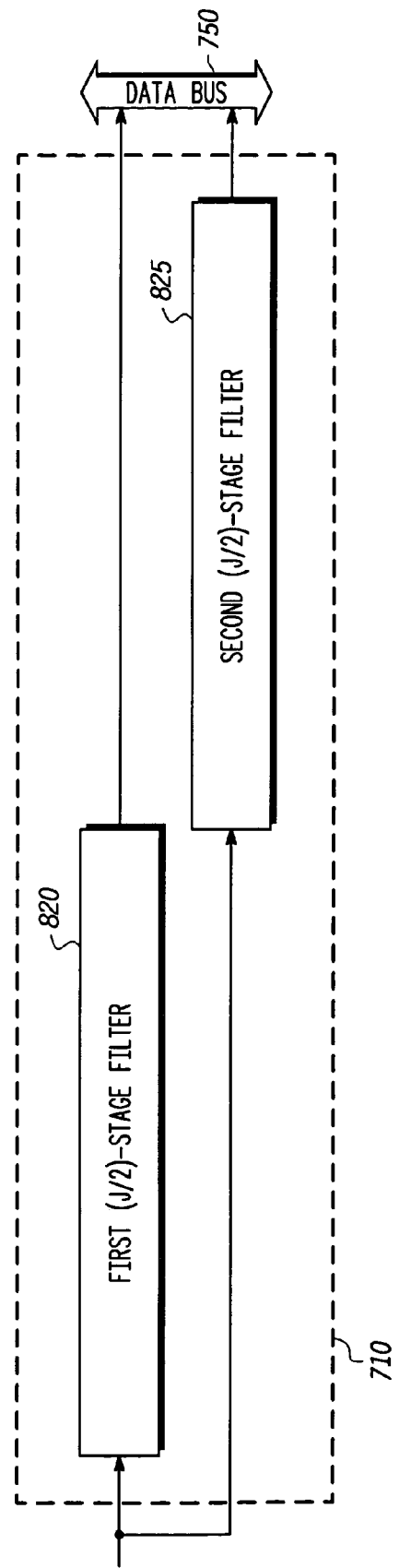
FIG. 8 is a block diagram of a multiple stage filter in which two taps are used.
Figure 9:
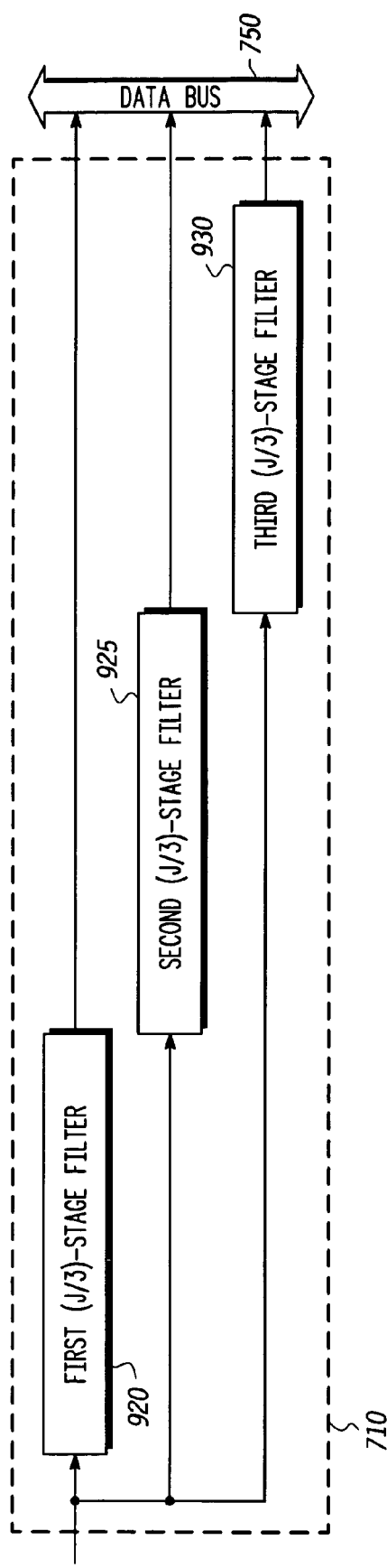
FIG. 9 is a block diagram of a multiple stage filter in which three taps are used.
Figure 10:
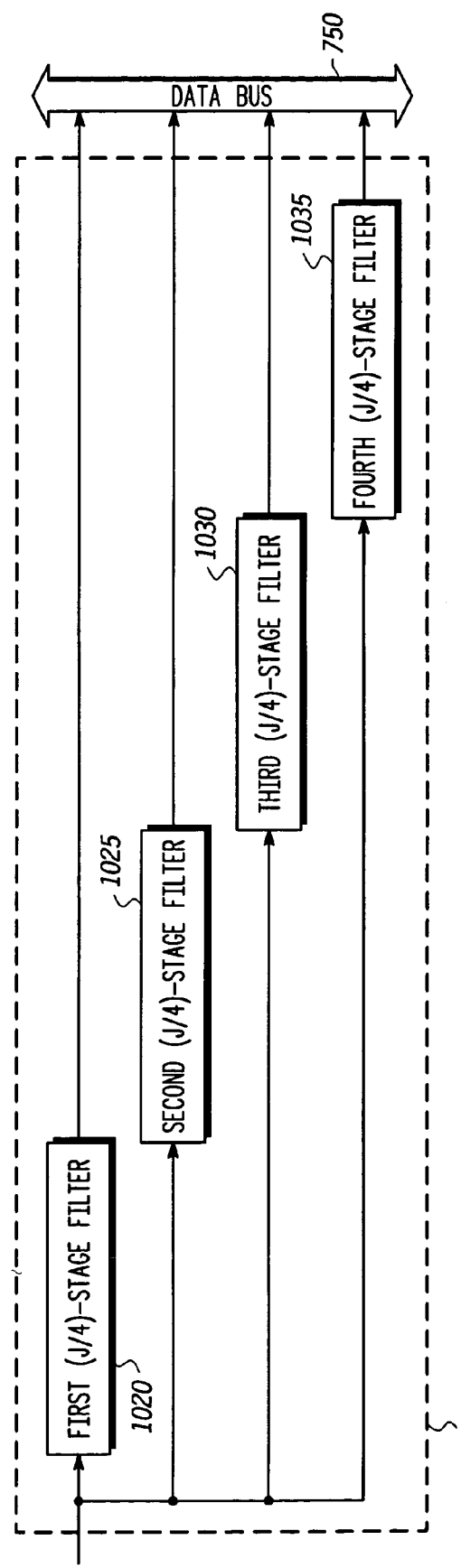
FIG. 10 is a block diagram of a multiple stage filter in which four taps are used.

FIGS. 7 to 10 are block diagrams showing a multiple stage filter with multiple taps according to one embodiment of the present invention. In particular, FIG. 7 is a block diagram of a multiple stage filter in which one tap is used; FIG. 8 is a block diagram of a multiple stage filter in which two taps are used; FIG. 9 is a block diagram of a multiple stage filter in which three taps are used; and FIG. 10 is a block diagram of a multiple stage filter in which four taps are used.

As shown in FIG. 7, a J-stage filter 710 can be tapped at the front and back to form a single J-stage filter 720. But, as shown in FIG. 8, the same J-stage filter 710 can be tapped at the front, in the middle, and at the end to form a first (J/2)-stage filter 820 and a second (J/2)-stage filter 825. Similarly, as shown in FIG. 9, the J-stage filter 710 can be tapped at the front, one-third of the way through, two-thirds of the way through, and at the end to form a first (J/3)-stage filter 920, a second (J/3)-stage filter 925, and a third (J/3)-stage filter 930. Likewise, as shown in FIG. 10, the J-stage filter 710 can be tapped at the front, one-quarter of the way through, halfway through, three-quarters of the way through, and at the end to form a first (J/4)-stage filter 1020, a second (J/4)-stage filter 1025, a third (J/4)-stage filter 1030, and a fourth (J/4)-stage filter 1035.

In each case, the individual stages will each receive the same input signal at the chipping rate C. Each stage will then operate at a filter rate equal to the symbol rate divided by the number of stages (e.g., in FIG. 9, each of the first through third (J/3)-stage filters 920, 925, and 930 will operate at the symbol rate divided by 3, i.e., $$\frac{C}{3L}).$$

The outputs of the various stages 720, 820, 825, 920, 925, 930, 1020, 1025, 1030, and 1035 are all provided to a data bus 950 when appropriate for further processing.

In an alternate embodiment, however, an output switch could then be provided with each J-stage filter, of the sort shown in FIGS. 4 and 6. This switch would be able to operate at a speed that will allow it to switch between the maximum number of lower-stage filters that can be arranged and still output at the desired speed. When fewer than the largest number of stages are used, the switch could select between the stages used, and operate at an appropriately adjusted switching rate. In alternate embodiments, however, the outputs of each filter could be provided as a parallel bus.

In the disclosed embodiment J is chosen to be a multiple of 12. This allows each J-stage filter to at the very least be split into 2, 3, 4, 6, or 12 equal filter portions. However, some alternate embodiments could use values of J that are multiples of 6. This will guarantee that each filter can at least be split into 2, 3, or 6 equal filter portions. Further embodiments could use values of J that are not multiples of 12 or 6. For example, in one alternate embodiment, J=16.

Consider an embodiment in which J=24, the chipping rate is 1326 MHz, and the data rates shown in Table 1 are used. In this embodiment the code word length can vary from 1 to 24, and a variety of FEC rates can be used.

When the code word length is 1, the system operates at its highest speed, i.e., about 1320 Mbps. In one embodiment a single 24-stage filter can be tapped to effectively provide 24 one-stage filters, which each operate at $$\frac{1}{24}^{th}$$

of the symbol rate, i.e., $$\frac{1320\ \text{MHz}}{24} = 55\ \text{MHz}.$$

A 24-input switch operating at 1320 MHz will sequentially select the outputs of each of the one-stage filters to provide a data output signal at 1320 MHz. If ¾ rate FEC is used, this output rate will drop by ¼ to about 1000 MHz. Because the filters used in this case are only one-stage, alternate embodiments could eliminate the fragmenting and selecting and instead use a single one-stage filter.

As shown in Table 1, when a code word length of 1 is used, the maximum range is between 2 and 5 meters, depending upon whether FEC is used. Because of these short ranges, there will be few multipath elements to the signal, and there will be a low multipath channel delay spread. As a result of this, the receiver will not need to use input filters with more than one stage to collect sufficient signal energy.

When the code word length is 2, the system operates at half of its highest speed, i.e., about 660 Mbps. In this embodiment a single 24-stage filter can be tapped to effectively provide 12 two-stage filters, which each operate at $$\frac{1}{12}^{th}$$

of the symbol rate, i.e., $$\frac{660\ \text{MHz}}{12} = 55\ \text{MHz}.$$

A 12-input switch operating at 660 MHz will sequentially select the outputs of each of the two-stage filters to provide a data output signal at 660 MHz. If ¾ rate FEC is used, this output rate will drop by ¼ to about 500 MHz.

As shown in Table 1, when a code word length of 2 is used, the maximum range is between 3 and 7.3 meters, depending upon whether FEC is used. Because these ranges remain short, there will still be few multipath elements to the signal, allowing for a relatively low multipath channel delay spread. As a result of this, the receiver will not need to use input filters with more than two stages to collect sufficient signal energy.

When the code word length is 3, the system operates at one-third of its highest speed, i.e., about 440 Mbps. In this embodiment a single 24-stage filter can be tapped to effectively provide 8 three-stage filters, which each operate at $$\frac{1}{8}^{th}$$

of the symbol rate, i.e., $$\frac{440\ \text{MHz}}{8} = 55\ \text{MHz}.$$

An 8-input switch operating at 440 MHz will sequentially select the outputs of each of the two-stage filters to provide a data output signal at 440 MHz. Since ½ FEC is used in this embodiment, the output rate will drop by ½ to about 220 MHz.

As shown in Table 1, when a code word length of 3 is used, the maximum range is 12.9 meters. This distance will allow some multipath elements to the signal, allowing for some multipath channel delay spread. However, the spread will be small enough that the receiver will not need to use input filters with more than three stages to collect sufficient signal energy.

When the code word length is 6, the system operates at one-sixth of its highest speed, i.e., about 220 Mbps. In this embodiment a single 24-stage filter can be tapped to effectively provide 4 six-stage filters, which each operate at ¼$^{th}$ of the symbol rate, i.e., $$\frac{220 \text{ MHz}}{4} = 55 \text{ MHz}.$$

A 4-input switch operating at 220 MHz will sequentially select the outputs of each of the two-stage filters to provide a data output signal at 220 MHz. Since ½ FEC is used in this embodiment, the output rate will drop by ½ to about 110 MHz.

As shown in Table 1, when a code word length of 6 is used, the maximum range is 18.3 meters. This distance will allow some multipath elements to the signal, allowing for some multipath channel delay spread. However, the spread will be small enough that the receiver will not need to use input filters with more than six stages to collect sufficient signal energy.

When the code word length is 12, the system operates at one-twelfth of its highest speed, i.e., about 110 Mbps. In this embodiment a single 24-stage filter can be tapped to effectively provide 2 twelve-stage filters, which each operate at ½ of the symbol rate, i.e.

$$\frac{110 \text{ MHz}}{2} = 55 \text{ MHz}.$$

A 2-input switch operating at 110 MHz will sequentially select the outputs of each of the two-stage filters to provide a data output signal at 110 MHz. Since ½ FEC is used in this embodiment, the output rate will drop by ½ to about 55 MHz.

As shown in Table 1, when a code word length of 12 is used, the maximum range is 22.1 meters. This distance will allow large multipath elements to the signal, allowing for significant multipath channel delay spread. However, the spread will be small enough that the receiver will not need to use input filters with more than twelve stages to collect sufficient signal energy.

When the code word length is 24 in a DS-UWB mode, the system operates at one-twenty-fourth of its highest speed, i.e., about 55 Mbps. In this embodiment a single 24-stage filter is not tapped at any intermediate locations, but is operated as a single twenty-four-stage filter, which operates at the symbol rate, i.e., 55 MHz. The output of this filter is directly provided as a data output signal at 55 MHz. Since ½ FEC is used in this embodiment, the output rate will drop by ½ to about 28 MHz.

As shown in Table 1, when a code word length of 24 is used in DS-UWB mode, the maximum range is 29.4 meters. This distance will allow large multipath elements to the signal, allowing for significant multipath channel delay spread. The spread in the disclosed embodiment will be large enough that the receiver can use an input filters with twenty-four stages to collect sufficient signal energy.

As shown in Table 1, when the code length is 24 the system can also operate in the common signaling mode (CSM). This will lower the data rate to 9.2 Mbps, but will allow communication between DS-UWB devices and MB-OFDM devices.

Although the description above states that switches should be used at the end of each filter array, alternate embodiments could provide the outputs of the fragmented filters as a parallel bus. Furthermore, although the description above notes that a 24 input switch, a 12-input switch, an 8-input switch, a 6-input switch, a 4-input switch, a 3-input switch, and a 2-input switch should be used, a single 24-input switch can be used that can be set to rotate through a smaller number of it's available inputs, effectively operating as smaller input switches as needed.

In addition, alternate embodiments could alter the operation of the fragmenting process, so long as the filter speed of each filter portion does not exceed a maximum easily achievable filter rate. For example, although the above embodiment discloses a filter rate of 55 MHz in each filter portion, the arrangement of filters could be altered such that the filter rate was 10 MHz. In this case more filters could be provided for each path than the minimum required.

Furthermore, although in the disclosed embodiments filter rates are kept constant for each stage, alternate embodiments could vary the filter rates among the stages, again so long as they always remain below a maximum easily achievable filter rate.

Also, although each of the above exemplary embodiments is disclosed using a single 24-stage filter, alternate embodiments could use more than one multiple-stage filter in parallel, reducing the required size of each individual filter.

In alternate embodiments the value of J can vary, different chipping rates can be used, the code word length can vary, and the FEC rates can be altered or FEC eliminated altogether. If, however, the filters are to be used for acquisition, the filter arrangement must be able to provide a number of parallel filters equal at least to the code word length L. This can be done by making $J \geq L$, or by having $(J \cdot M) \geq L$, where J is the number of stages in a single filter, M is the number of filters placed in parallel, and L is the code word length.

Although only 1-stage, 2-stage, 3-stage, and 4-stage embodiments are shown in FIGS. 7 to 10, these are for illustrative purposes only. Other ways of breaking up multiple stage filters can be used in alternate embodiments. For example, large enough filters can be broken up into more than four stages.

Also, although filters may be broken up into filter portions that are the same size (i.e., all filters portions acting in parallel should be the same size), not all stages in a multiple stage filter must be used. For example, if a 16-stage filter is split up into three filter portions, it could be tapped such that the filter portions were 5-stage filters, with one filter stage unused.

Mixture of Parallel and Fragmentable Filters

Figure 11:
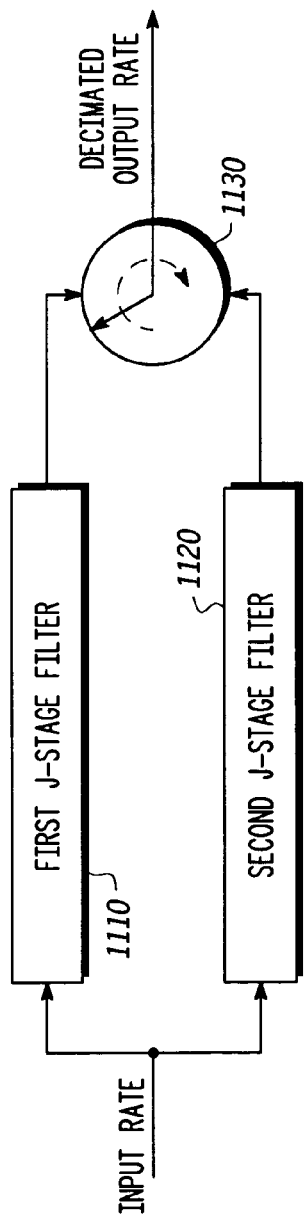
FIGS. 11 and 12 are block diagrams of an input structure design according to one embodiment of the present invention.
Figure 12:
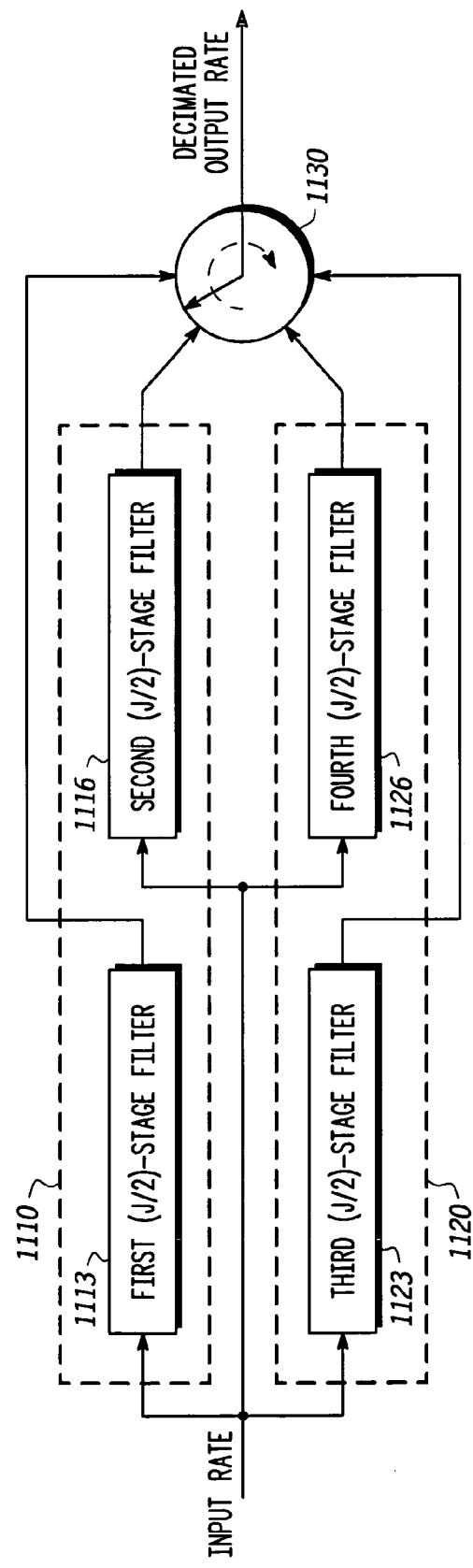

In alternate embodiments, a combination of parallel filters and fragmentable filters can be used. FIGS. 11 and 12 are block diagrams of an input structure design according to one embodiment of the present invention.

As shown in FIGS. 11 and 12, the input structure includes a first J-stage filter 1110, a second J-stage filter 1120, and a switch 1130. In FIG. 11, the input structure is operated such that the first and second J-stage filters 1110 and 1120 each perform as a single filter. Each J-stage filter functions at half the output rate and the switch 1130 operates at the output rate, selecting between the output of the first and second J-stage filters 1110 and 1120 in turn.

In FIG. 11, the input structure is operated such that the first and second J-stage filters 1110 and 1120 each perform as a two filters. Thus, the first J-stage filter 1110 operates as first and second (J/2)-stage filters 1113 and 1116, while the second J-stage filter 1120 operates as third and fourth (J/2)-stage filters 1123 and 1126. Each (J/2)-stage filter functions at one-quarter the output rate and the switch 1130 operates at the output rate, selecting between the output of the first through fourth (J/2)-stage filters 1113, 1116, 1123, and 1126 in turn.

In alternate embodiments the number of parallel J-stage filters can be altered, and the number of stages and taps in each of the J-stage filters can be varied.

Selection of Taps

Figure 13:
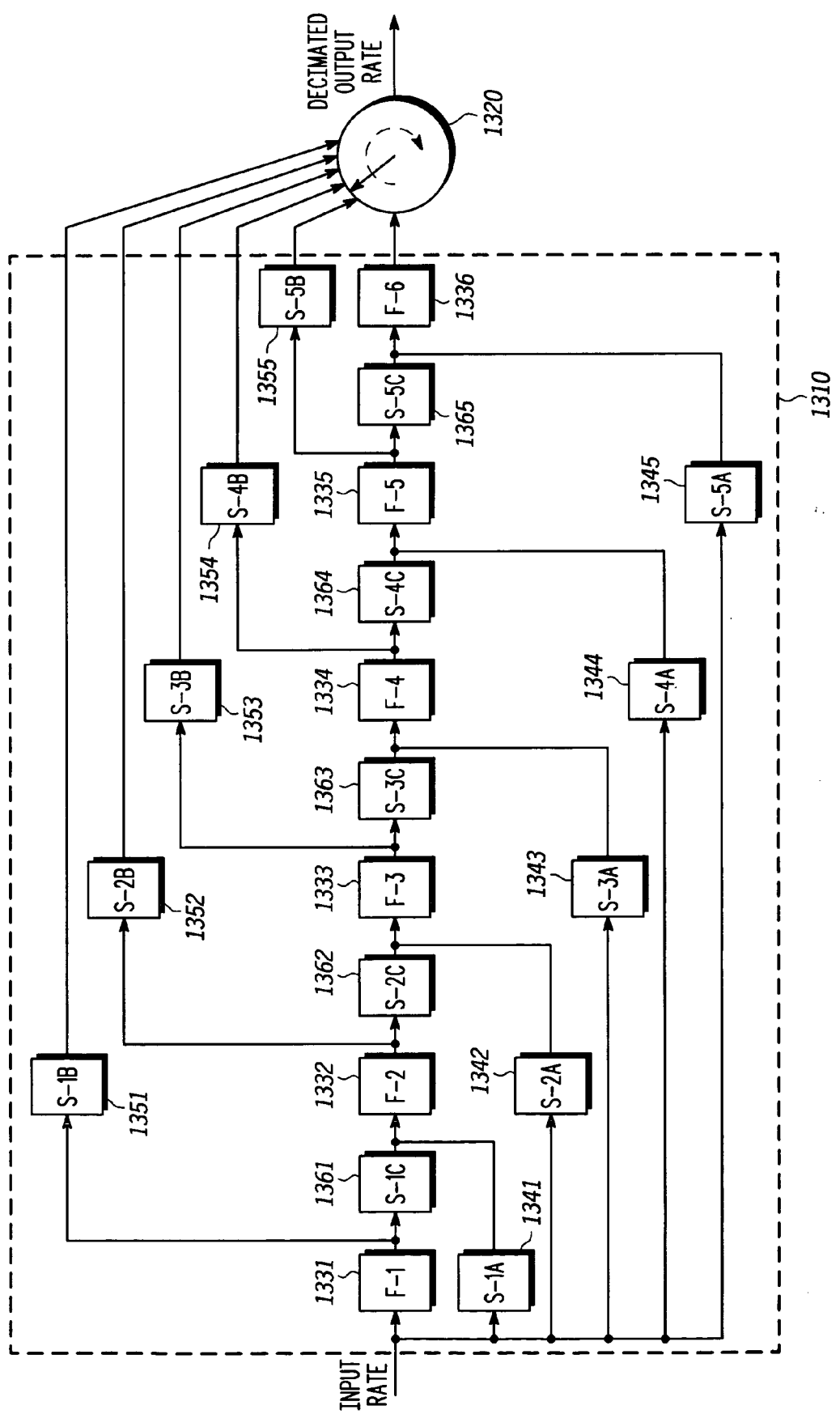
FIG. 13 is a diagram illustrating switches for selecting various taps in a multiple stage filter according to one embodiment of the present invention.

The actual selection of various taps in a multiple-stage filter can be achieved in a variety of ways. FIG. 13 is a diagram illustrating switches for selecting various taps in a multiple stage filter according to one embodiment of the present invention. As shown in FIG. 13, the disclosed multiple-stage filter 1310 includes six separate filter stages 1331–1336. The filter 1310 also includes first through fifth input switches 1341–1345, first through fifth output switches 1351–1355, and first through fifth isolation switches 1361–1365.

The input of the first filter stage 1331 and the inputs of the first through five input switches 1341–1345 are connected to an input signal that is received at the input rate (e.g., at the chipping rate C). The outputs of the first through fifth filter stages 1331–1335 are connected to both the inputs of the first through fifth output switches 1351–1355, respectively, and the inputs of the first through fifth isolation switches 1361–1365, respectively. The outputs of the first through fifth isolation switches 1361–1365 are connected to the inputs of the second through sixth filter stages 1332–1336, respectively. The output of the sixth filter stage 1336 and the output of the first through fifth output switches 1351–1355 are connected to the inputs of an n-input switch 1320 (where n=6, i.e., the number of input stages). And the output of the n-input switch 1320 is provided as an output signal that is provided at the output rate $$\left(e.g., \text{ at the symbol rate } \frac{C}{L}\right).$$

The various switches 1341–1345, 1351–1355, and 1361–1365 are manipulated to create the needed filter stages. Table 2 shows how the filter disclosed in FIG. 13 can be used as a 1-stage filter, a 2-stage filter, a 3-stage filter, and a 6-stage filter by controlling the switches 1341–1345, 1351–1355, and 1361–1365. In Table 1, an "O" indicates an open switch, and a "C" indicates a closed switch. For ease of description, the first through fifth input switches 1341–1345 are designated as switches 1A–5A, the first through fifth output switches 1351–1355 are designated as switches 1B–5B, and the first through fifth isolation switches 1361–1365 are designated as switches 1C–5C. These labels are also used on the switches 1341–1345, 1351–1355, and 1361–1365 in FIG. 13.

When one filter is created according to Table 2, it will be a 6-stage filter. When two filters are created according to Table 2, they will be 3-stage filters. When three filters are created according to Table 2, they will be 2-stage filters. And when six filters are created according to Table 2, they will be 1-stage filters.

TABLE 2

| Switches Filter #s | 1A/1B | 2A/2B | 3A/3B | 4A/4B | 5A/5B | 1C | 2C | 3C | 4C | 5C |
|---|---|---|---|---|---|---|---|---|---|---|
| 1 | O | O | O | O | O | C | C | C | C | C |
| 2 | O | O | C | O | O | C | C | O | C | C |
| 3 | O | C | O | C | O | C | O | C | O | C |
| 6 | C | C | C | C | C | O | O | O | O | O |

The switches in this embodiment can be any kind of digital switch, e.g., those designed from transistors.

Although FIG. 13 shows a six-stage filter, this is by way of example only. Alternate embodiments can use different stages as needed. The selection process for various stages will be analogous to that shown above for a filter 1310 with six stages.

Also, the switches 1341–1345, 1351–1355, and 1361–1365 can be operated to create other sub-filters that are not equal in size. For example it is possible to create two filters, one 2-stage filter and one 4-stage filter, or one 1-stage filter and one 5- stage filter. For larger numbers of stages, additional possibilities exist.

In addition, the switches 1341–1345, 1351–1355, and 1361–1365 can be operated such that not all stages are used. For example, it is possible to create one 2-stage filter, one 3-stage filter, and leave one stage unused.

Additional Modifications

In some embodiments the input signal can be provided at an over-sampled input rate of (C×s), where s is an over-sampling factor. In some embodiments s will vary between 1 and 4, though larger values can be used for some implementations.

In addition, although the disclosed embodiments operate as the symbol speed, the present invention is equally applicable to situations in which the filters are operating at a filter speed equal to the chipping rate.

To understand the advantages of this natural scaling, consider instead an MB-OFDM implementation that uses a high speed FFT engine for demodulation. This approach requires the full FFT calculation and frequency-domain equalization, regardless of the delay spread of the channel. Whether the multipath is severe, mild or non-existent, both the MB-OFDM waveform and the FFT-based processing are always "tuned" to collect multipath energy over a 60.5 ns interval (the length of the guard interval). If the multipath delay spread is short, the MB-OFDM FFT engine significantly "over-processes" the signal, yet the signal still suffers Rayleigh fading because multipath is not resolved. If the delay spread is very long (>60 ns), the MB-OFDM waveform will fail to prevent ISI and performance will again suffer—unless an additional time-domain equalizer is also implemented (extra complexity).

The operation of the energy capture and equalization functions at the symbol rate for DS-UWB also lead to a significant advantage over other DS approaches, such as MBOK. For MBOK receivers, CMF structures that match to a single "chip" would need to operate at the higher chip rate, not the symbol rate. As a result, BPSK rake or CMF receivers could operate at much lower rates than MBOK receivers depending on the symbol rate. Also, the scaling of DFE structures for large MBOK constellations (such as 64-BOK) leads to high complexity requirements in order to realize the benefits of equalization.

Thus, the present DS-UWB design provides several advantages in complexity and chip size. It allows for a rake or CMF structures that operate at the symbol rate instead of chip rate (which can have a significantly lower complexity for the equivalent energy capture, depending on data rate). It provides for equalizers (linear or DFE) that operate at the symbol rate, not the chip rate (which also allows a significantly lower complexity for equalizer implementations.) It requires no MBOK correlator (which can result in a reduction of up to 6100 gates, as estimated by MBOA). It provides for a 50% reduction in FEC Viterbi decoder complexity (which can halve the number of gates, e.g., to 54K gates instead of 108K gates, as estimated by MBOA). And it requires no IFFT/FFT engines (i.e., an elimination of up to 70–100K gates at 132 MHz clock speed).

For the disclosed DS-UWB design the reductions in receiver complexity are significant. Whereas previous DS-UWB receiver complexity estimates ranged from 85–135% of an equivalent MB-OFDM receiver, now a well-designed DS-UWB receiver can have less than half of the digital complexity of the MB-OFDM receiver. Table 3 provides a summary of some digital complexity estimates for various architectures that have been proposed for both DS-UWB and MB-OFDM receivers.

TABLE 3

| Architecture | Contains Equalizer? | Source | Gate Count Est. (at 85.5 MHz) | % of MB-OFDM Complexity |
|---|---|---|---|---|
| MBOK 16-finger rake no equalizer | No | MBOA | 624,000 | 137% |
| MBOK CMF, 1-bit ADC no equalizer | No | DS | 395,000 | 87% |
| MBOK CMF, 1-bit ADC no equalizer | No | MBOA | 604,000 | 132% |
| MB-OFDM, 4-bit ADC with equalizer | Yes | MBOA | 455,000 | 100% |
| DS-UWB, 16-finger rake with equalizer | Yes | Improved DS-UWB | 191,000 137,000* | 42% 30%* |
| DS-UWB, CMF 1-bit ADC with equalizer | Yes | Improved DS-UWB | 189,000 135,000* | 42% 30%* |

Reductions in complexity in the disclosed DS-UWB devices are in part a result of simplified FEC (54K gate reduction), no MBOK demodulator (61K gate reduction) and simplified rake/CMF and equalizer structures. Also, note that in the DS-UWB designs, extremely low-power/high-rate operation can be achieved for un-coded DS-UWB modes (designated by an asterisk "*") where the Viterbi decoder and interleaver are not required for operation and can be powered-down.

CONCLUSIONS

The disclosed DS-UWB design provides scalable performance across a wide range of application requirements. This design leads to significant reductions in implementation complexity as compared to other proposed UWB PHY designs, while allowing increased scalability to high data-rate and low-power applications. This means that performance for applications such as high-rate data transfers for power-constrained handheld devices can significantly improved relative to current UWB PHY proposals. At the same time, the DS-UWB approach benefits from the significant benefits of true UWB operation, i.e., low fading in multipath, optimal interference characteristics, inherent frequency diversity and precision ranging capabilities.

Although this disclosure discusses a UWB device using the IEEE 802.15.3a standard by way of example, the general design is also applicable to other wireless networks, and should not be considered to be limited to application with respect to IEEE 802.15.3a networks.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A multiple-stage filtering circuit, comprising:
   first through $N^{th}$ filter stages, formed in series, having first through $N^{th}$ input lines and first through $N^{th}$ output lines, respectively, each of the first through $N^{th}$ filter stages being configured to perform a filtering function;
   an output circuit configured to provide a filter output signal;
   input selection circuitry configured to selectively connect a filter input signal to any of the first through $N^{th}$ input lines;
   output selection circuitry configured to selectively connect any of the first through $N^{th}$ output lines to the output circuit; and
   filter stage isolation circuitry configured to selectively isolate any adjacent pair of the first through $N^{th}$ filter stages,
   wherein N is an integer greater than one.

2. A multiple-stage filtering circuit, as recited in claim 1, wherein the output circuit is a parallel data bus.

3. A multiple-stage filtering circuit, as recited in claim 1, wherein the output circuit is an N-input, single output switch.

4. A multiple-stage filtering circuit, as recited in claim 1, wherein N is evenly divisible by 6.

5. A multiple-stage filtering circuit, as recited in claim 1, wherein the multiple-stage filtering circuit is implemented in an integrated circuit.

6. A multiple-stage filtering circuit, as recited in claim 1, wherein the multiple-stage filtering circuit is implemented in an ultrawide bandwidth device.

7. A multiple-stage filtering circuit, as recited in claim 1, wherein the input selection circuitry comprises a plurality of switches connected between the second through $N^{th}$ input lines and the filter input signal.

8. A multiple-stage filtering circuit, as recited in claim 1, wherein the output selection circuitry comprises a plurality of switches connected between the first through $(N-1)^{th}$ output lines and the output selection circuitry.

9. A multiple-stage filtering circuit, as recited in claim 1, wherein the filter isolation circuitry comprises a plurality of switches connected between pairs of the first through $N^{th}$ filter stages.

10. A multiple-stage filtering circuit, as recited in claim 1, wherein the first input line of the first filter stage is directly connected to the filter input signal.

11. A multiple-stage filtering circuit, as recited in claim 1, wherein the $N^{th}$ output line of the $N^{th}$ filter stage is directly connected to the output circuit.

12. A method of configuring a filter having N filter stages, comprising:
- configuring the N-stage filter during a first transmission environment into $J_1$ first parallel sub-filters, each first parallel sub-filter comprising $K_1$ consecutive filter stages from the N-stage filter;
- configuring the N-stage filter during a second transmission environment into $J_2$ second parallel sub-filters, each second parallel sub-filter comprising $K_2$ consecutive filter stages from the N-stage filter;
- wherein $J_1, J_2, K_1$, and $K_2$ are integers that each vary from 1 to N,
- wherein $J_1 > J_2$ and $K_1 < K_2$, and
- wherein $(J_1 \times K_1) \leq N$ and $(J_2 \times K_2) \leq N$.

13. A method of configuring a filter having N filter stages, as recited in claim 12,
- wherein the first transmission environment has a first maximum effective range longer than a second maximum effective range for the second transmission environment, and
- wherein the first transmission environment has a first maximum effective transmission speed slower than a second maximum effective transmission speed of the second transmission environment.

14. A method of configuring a filter having N filter stages, as recited in claim 12, further comprising:
- configuring the N-stage filter during a third transmission environment into $J_3$ third parallel sub-filters, each third parallel sub-filter comprising $K_3$ consecutive filter stages from the N-stage filter,
- wherein $J_3$ and $K_3$ are each integers that each vary from 1 to N,
- wherein $J_1 \geq J_3 > J_2$, and $K_1 < K_3 \leq K_2$, and
- wherein $(J_3 \times K_3) \leq N$.

15. A method of configuring a filter having N filter stages, as recited in claim 14,
- wherein the third transmission environment has a third maximum effective range shorter than the first maximum effective range for the first transmission environment, but longer than the second maximum effective range for the second transmission environment, and
- wherein the third first transmission environment has a third maximum effective transmission speed faster than the first maximum effective transmission speed of the first transmission environment, but slower than the second maximum effective transmission speed of the second transmission environment.

16. A method of configuring a filter having N filter stages, as recited in claim 12, further comprising:
- configuring the N-stage filter during a third transmission environment into $J_3$ third parallel sub-filters, each third parallel sub-filter comprising $K_3$ consecutive filter stages from the N-stage filter,
- wherein $J_3$ and $K_3$ are integers that each vary from 1 to N,
- wherein $J_1 > J_3 \geq J_2$, and $K_1 \leq K_3 < K_2$, and
- wherein $(J_3 \times K_3) \leq N$.

17. A method of configuring a filter having N filter stages, as recited in claim 16,
- wherein the third transmission environment has a third maximum effective range shorter than the first maximum effective range for the first transmission environment, but longer than the second maximum effective range for the second transmission environment, and
- wherein the third first transmission environment has a third maximum effective transmission speed faster than the first maximum effective transmission speed of the first transmission environment, but slower than the second maximum effective transmission speed of the second transmission environment.

18. A method of configuring a filter having N filter stages, as recited in claim 12, wherein N is evenly divisible by 6.

19. A method of configuring a filter having N filter stages, as recited in claim 12, further comprising
- providing first output signals from the $J_1$ first parallel sub-filters to a switch during a first transmission environment; and
- providing second output signals from the $J_2$ second parallel sub-filters to the switch during a second transmission environment.

20. A method of configuring a filter having N filter stages, as recited in claim 12, further comprising
- providing first output signals from the $J_1$ first parallel sub-filters to a data bus during a first transmission environment; and
- providing second output signals from the $J_2$ second parallel sub-filters to the data bus during a second transmission environment.

21. A method of configuring a filter having N filter stages, as recited in claim 12, wherein the method is implemented in an integrated circuit.

22. A method of configuring a filter having N filter stages, as recited in claim 12, wherein the method is implemented in an ultrawide bandwidth device.

* * * * *

UNITED STATES PATENT AND TRADEMARK OFFICE
CERTIFICATE OF CORRECTION

| | | |
|---|---|---|
| PATENT NO. | : 7,002,940 B2 | Page 1 of 1 |
| APPLICATION NO. | : 10/868948 | |
| DATED | : June 17, 2004 | |
| INVENTOR(S) | : Matthew L. Welborn | |

It is certified that error appears in the above-identified patent and that said Letters Patent is hereby corrected as shown below:

In Column 19, Line 52, Claim No. 15:

Change "wherein the third first transmission environment has a" to --wherein the third transmission environment has a--

In Column 20, Line 21, Claim No. 17:

Change "wherein the third first transmission environment has a" to --wherein the third transmission environment has a--

Signed and Sealed this

Twenty-ninth Day of July, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,002,940 B2 | Page 1 of 1 |
| APPLICATION NO. | : 10/868948 | |
| DATED | : February 21, 2006 | |
| INVENTOR(S) | : Matthew L. Welborn | |

It is certified that error appears in the above-identified patent and that said Letters Patent is hereby corrected as shown below:

In Column 19, Line 52, Claim No. 15:

Change "wherein the third first transmission environment has a" to --wherein the third transmission environment has a--

In Column 20, Line 21, Claim No. 17:

Change "wherein the third first transmission environment has a" to --wherein the third transmission environment has a--

This certificate supersedes the Certificate of Correction issued July 29, 2008.

Signed and Sealed this

Twenty-sixth Day of August, 2008

JON W. DUDAS
*Director of the United States Patent and Trademark Office*